United States Patent [19]

Nakashima

[11] Patent Number: 5,640,047
[45] Date of Patent: Jun. 17, 1997

[54] BALL GRID ASSEMBLY TYPE SEMICONDUCTOR DEVICE HAVING A HEAT DIFFUSION FUNCTION AND AN ELECTRIC AND MAGNETIC SHIELDING FUNCTION

[75] Inventor: Takashi Nakashima, Kitakyushu, Japan

[73] Assignee: Mitsui High-Tec, Inc., Kitakyushu, Japan

[21] Appl. No.: 641,351

[22] Filed: Apr. 30, 1996

[30] Foreign Application Priority Data

Sep. 25, 1995 [JP] Japan ................... 7-271791

[51] Int. Cl.$^6$ ................... H01L 23/48; H01L 23/52; H01L 29/40
[52] U.S. Cl. ................... 257/738; 257/693; 257/698; 257/700; 257/780
[58] Field of Search ................... 257/693, 698, 257/700, 738, 780

[56] References Cited

U.S. PATENT DOCUMENTS

| | | | |
|---|---|---|---|
| 5,138,433 | 8/1992 | Hiruta | 357/72 |
| 5,172,303 | 12/1992 | Bernardoni et al. | 361/396 |
| 5,239,198 | 8/1993 | Lin et al. | 257/693 |
| 5,241,133 | 8/1993 | Mullen, III et al. | 174/52.4 |
| 5,285,352 | 2/1994 | Pastore et al. | 361/707 |
| 5,293,072 | 3/1994 | Tsuji et al. | 257/737 |
| 5,303,119 | 4/1994 | Hilbrink | 361/749 |
| 5,308,443 | 5/1994 | Sugihara | 156/644 |
| 5,442,230 | 8/1995 | Chillara et al. | 257/666 |
| 5,450,290 | 9/1995 | Boyko et al. | 361/792 |
| 5,468,999 | 11/1995 | Lin et al. | 257/784 |
| 5,523,622 | 6/1996 | Harada et al. | 257/734 |
| 5,541,450 | 7/1996 | Jones et al. | 257/697 |

*Primary Examiner*—Ngân V. Ngô
*Assistant Examiner*—Allan R. Wilson
*Attorney, Agent, or Firm*—Armstrong, Westerman, Hattori, McLeland & Naughton

[57] ABSTRACT

A semiconductor device comprises a circuit substrate being provided with a first lead pattern and a second lead pattern on a front surface and rear surface thereof respectively. The first lead pattern includes a die mounting region and conductive leads. The second lead pattern includes first outer connecting terminal lands connected with the die mounting region by way of first vias, second outer connecting terminal lands connected with the conductive leads of the first lead pattern by way of second vias, and a ground plane connected with the first outer connecting terminal lands while being electrically and magnetically shielded from the second outer connecting terminal lands. Solder balls are mounted on the first and second outer connecting terminal lands respectively. A semiconductor die is fixedly mounted on the die mounting region. Bonding wires connect electrode pads mounted on the semiconductor die with the conductive leads respectively. A resin package seals the semiconductor die and the bonding wires on the front surface of the circuit substrate. The semiconductor device effectively restricts the occurrence of cross talk noises caused by parasitic current on the conductive layer, improves heat diffusion of the semiconductor device and effectively prevents malfunctions of semiconductor devices caused by electromagnetic noises.

11 Claims, 3 Drawing Sheets

BALL GRID ASSEMBLY TYPE SEMICONDUCTOR DEVICE HAVING A HEAT DIFFUSION FUNCTION AND AN ELECTRIC AND MAGNETIC SHIELDING FUNCTION

BACKGROUND OF INVENTION

The present invention relates a PBGA (plastic ball grid array) type semiconductor device, more particularly a semiconductor die mounted circuit substrate thereof which mounts a lead pattern on one surface thereof and such a lead pattern comprises a ground plane which has a heat diffusion function as well as a grounding function and a plurality of spaced-apart outer connecting terminal lands to which solder balls are connected.

Recently, to meet the demand for miniaturing of semiconductor dies, down-sizing of the semiconductor devices and lowering of the production cost of the semiconductor devices, semiconductor devices called BGA which use a plurality of solder balls distributed in a grid array as the outer connecting terminals of semiconductor devices have been proposed, wherein such semiconductor devices are mounted on a mounting pad on the mounting plate. Such devices are, for example, disclosed in U.S. Pat. No. 5,045, 921 (Lin et al.) and U.S. Pat. No. 5,216,278 (Lin et al).

Such a BGA type semiconductor device substantially comprises;

a semiconductor die mounting substrate wherein the substrate is prepared from polyimide resin tape or glass fabrics reinforced epoxy resin, a first lead pattern which is made of a plurality of spaced-apart first conductive leads is mounted on a peripheral portion of one surface of the substrate which encircles a die mounting region defined at the central portion of one surface of the substrate, and a second lead pattern which is made of a plurality of second conductive leads which are respectively connected with the first conductive leads by way of vias is mounted on the other surface of the substrate, a semiconductor die mounted on the semiconductor die mounting region of the semiconductor die mounting substrate, a plurality of bonding wires which provide an electrically conductive circuit by connecting a plurality of electrode pads mounted on the semiconductor die with a plurality of wire bonding pads of a plurality of first conductive leads, a sealing resin agent which may preferably be made of epoxy resin and the like for sealing the mounting surface of the semiconductor die together with the bonding wires provided on the mounting surface, and a plurality of solder balls which are respectively electrically connected with a plurality of outer connecting terminal lands of a plurality of the second conductive leads, solder balls being provided for connecting the semiconductor device to a printed wiring board located outside.

In the above construction, each first conductive lead is provided with a wire bonding pad at one end thereof and a via on the other end thereof which passes through the semiconductor die mounting board. The solder balls are mounted on the other surface of the semiconductor die mounting substrate in a grid array.

In the conventional BGA type semiconductor device (PBGA type semiconductor device in a more accurate term) having the above-mentioned construction, however, since a multiplicity of bonding wires which are connected with the semiconductor die mounted on one surface of the substrate, a multiplicity of conductive leads which constitute the first lead pattern and a multiplicity of conductive leads which constitute the second lead pattern and are connected with the conductive leads of the first lead pattern by way of vias are concentrated or compacted at one place, the device has following drawbacks.

a) Heat generated from the semiconductor die cannot be diffused sufficiently so that any semiconductor die which consumes an electric power exceeding, for example, 3 watt cannot be mounted.

b) Due to magnetic noises such as cross talks which are caused by crossing or coming close of adjacent signal lines as well as deterioration of electrical characteristics caused by elongated conductive circuits, high frequency characteristics is deteriorated so that the semiconductor device having a response of more than 100 MHz cannot be produced.

c) Furthermore, in the conventional semiconductor device, since the front surface of the electrically insulating substrate on which the first conductive leads are mounted is directly sealed by resin, a sufficient adhering strength is not achieved between the insulating substrate and the sealed resin. Accordingly, the sealed resin is easily peeled off giving rise to an infiltration of moisture through a gap defined between the insulating substrate and the sealed resin thus showing poor resistance to moisture.

Accordingly, it is an object of the present invention to provide a semiconductor device which can meet a demand for a highly improved function and performance by overcoming the above-mentioned drawbacks of conventional semiconductor device, wherein the conductive circuits can be made considerably short thus effectively restricting the occurrence of cross talk noises caused by the parasitic current on the conductive layer, improving the heat diffusion of the semiconductor device and effectively preventing malfunctions of semiconductor device caused by electromagnetic noises.

SUMMARY OF INVENTION

The present invention discloses a semiconductor device comprising a) a circuit substrate being provided with a first lead pattern and a second lead pattern on a front surface and rear surface thereof respectively, the first lead pattern including a die mounting region which is provided at the central portion on the front surface of the circuit substrate and a plurality of conductive leads which are arranged around the die mounting region on the front surface of the circuit substrate, the second lead pattern including a plurality of first outer connecting terminal lands which are connected with the die mounting region by way of a plurality of first vias, a plurality of second outer connecting terminal lands which are connected with the conductive leads of the first lead pattern by way of a plurality of second vias, a ground plane which is electrically connected with the first outer connecting terminal lands while being electrically and magnetically shielded from the second outer connecting terminal lands by means of a plurality of annular gaps defined around said second outer connecting terminals, b) a plurality of solder balls which are mounted on the first and second outer connecting terminal lands respectively, c) a semiconductor die fixedly mounted on the die mounting region by means of an electrically conductive adhering agent, d) a plurality of bonding wires which connects a plurality of electrode pads mounted on the semiconductor die with a plurality of the conductive leads respectively, and e) a resin package which seals the front surface of the circuit substrate on which the semiconductor die and the bonding wires are mounted.

In this manner, according to the present invention, since the second outer connecting terminal lands are directly connected with the first lead pattern to which the semiconductor die is connected by means of the second vias and the second outer connecting terminal lands are directly connected with the solder balls, signal transmitting lines directed toward the semiconductor die can be made considerably short thus drastically improving the electrical efficiency.

Furthermore, since the die mounting region is connected with the first outer connecting terminal lands by way of the first vias and the first outer connecting terminal lands are directly connected with solder balls, the heat generated by the semiconductor die is diffused outside by way of the electrically conductive adhering agent, the die mounting region, the first vias, the first outer connecting terminal lands and the ground plane and eventually diffused by way of the solder balls connected with the first outer connecting terminals.

Still furthermore, since the ground plane is electrically connected with the first outer connecting terminal lands and a part of the ground plane which acts as a ground is disposed around the second outer connecting terminal lands with a desired gap or space, the second outer connecting terminal lands and the solder balls which are connected with the second outer connecting terminal lands are electrically and magnetically shielded so that the occurrence of parasitic current on the first and second lead patterns can be restricted whereby the rupture of semiconductor die and the occurrence of noise such as cross talk can be prevented.

In the above-mentioned semiconductor device, the first lead pattern may preferably be coated with a first dielectric layer and the second lead pattern may preferably be coated with a second dielectric layer with an exception of the first and second outer connecting terminal lands.

Due to such a provision, the insulation and the erosion resistance of the first and second lead patterns can be greatly enhanced.

The first and second dielectric layers may preferably be a solder resist film layer made of a photo-curing dry film or a solder resist film layer formed by silk screen printing method.

The second dielectric layer may preferably be provided with a multiplicity of dimples or anchoring holes on the surface. Accordingly, the adhesive strength of the resin package molded on the second dielectric layer can be increased thus effectively preventing the peeling off of the molded resin.

The first and second vias may preferably be made of electroless copper platings provided on inner walls of a plurality of through holes formed in the circuit substrate in place and a plurality of electrically conductive pastes filled in the through holes. Alternatively, the first and second vias may preferably be made of a plurality of electrically conductive pastes which are directly filled in a plurality of through holes formed in the circuit substrates in place.

Due to such a provision, the first and second vias can be readily connected with the solder balls and the thermal and electrical transmitting efficiency from the first lead pattern to the second lead pattern is enhanced. The electrically conductive paste may preferably be made of a copper paste or a silver paste or other similar paste.

Each first or second via comprises an electroless copper plating provided on the inner wall of each through hole formed in the circuit substrates in place and solder resin filled in the through hole. In this case, although the thermal and electrical transmitting efficiency from the first lead pattern to the second lead pattern is not enhanced, the cavity defined in the through hole is filled with solder resin as in the case of the above-mentioned filling of the electrically conductive paste in the through hole so that the first and second vias can be readily connected with the solder balls while enhancing the operability.

DETAILED DESCRIPTION OF PREFERRED EMBODIMENT OF THE PRESENT INVENTION

The semiconductor device according to one embodiment of the present invention will be explained in conjunction with the attached drawings.

Figure 1:
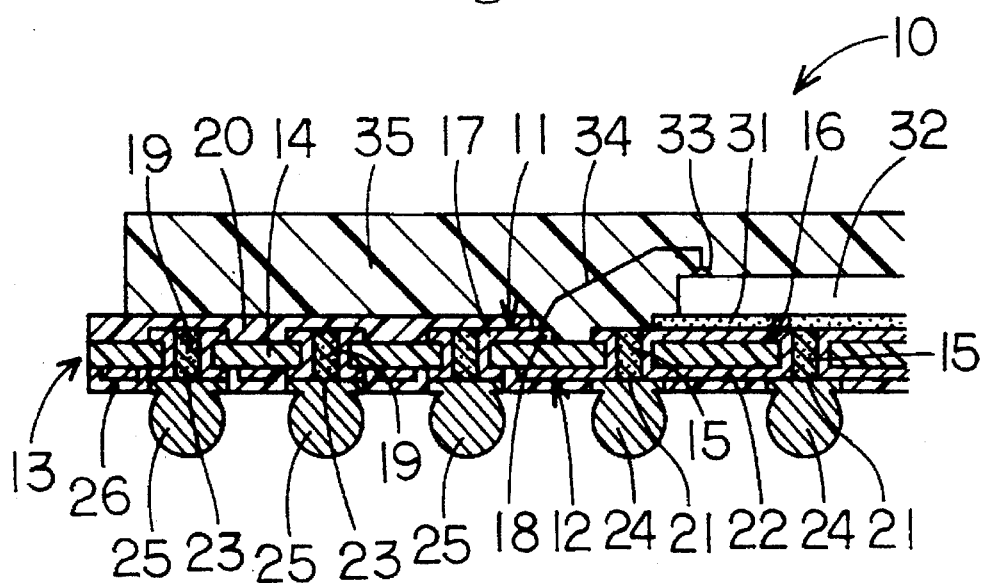
FIG. 1 is a cross sectional view of an essential portion of a semiconductor device according to one embodiment of the present invention.
Figure 2:
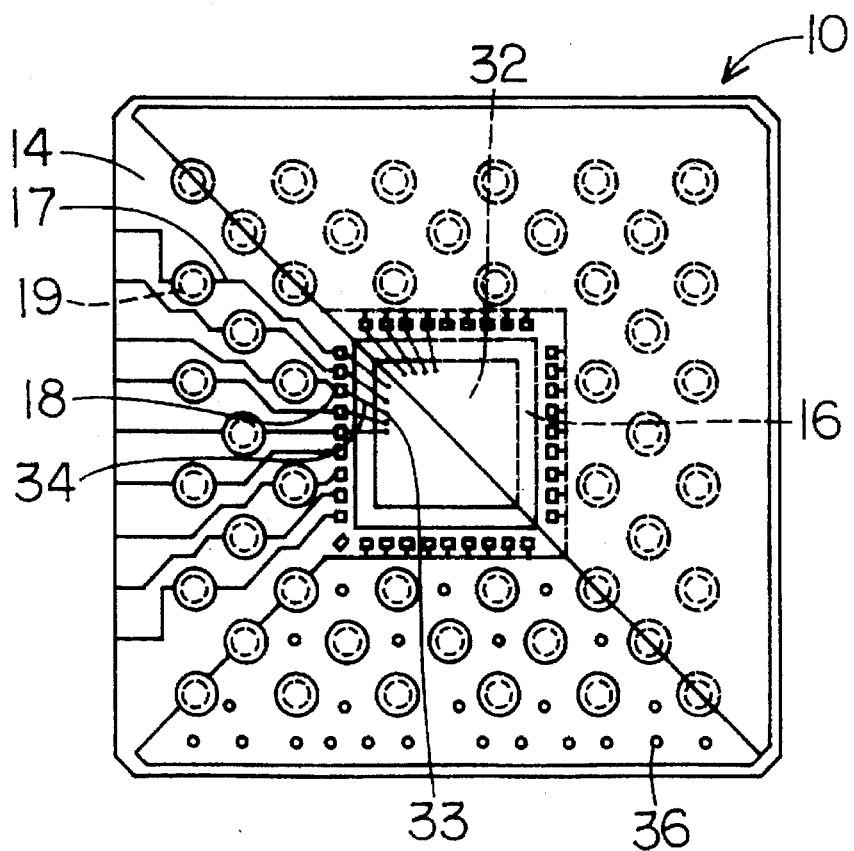
FIG. 2 is a plan view with a part broken away of the semiconductor device.
Figure 3:
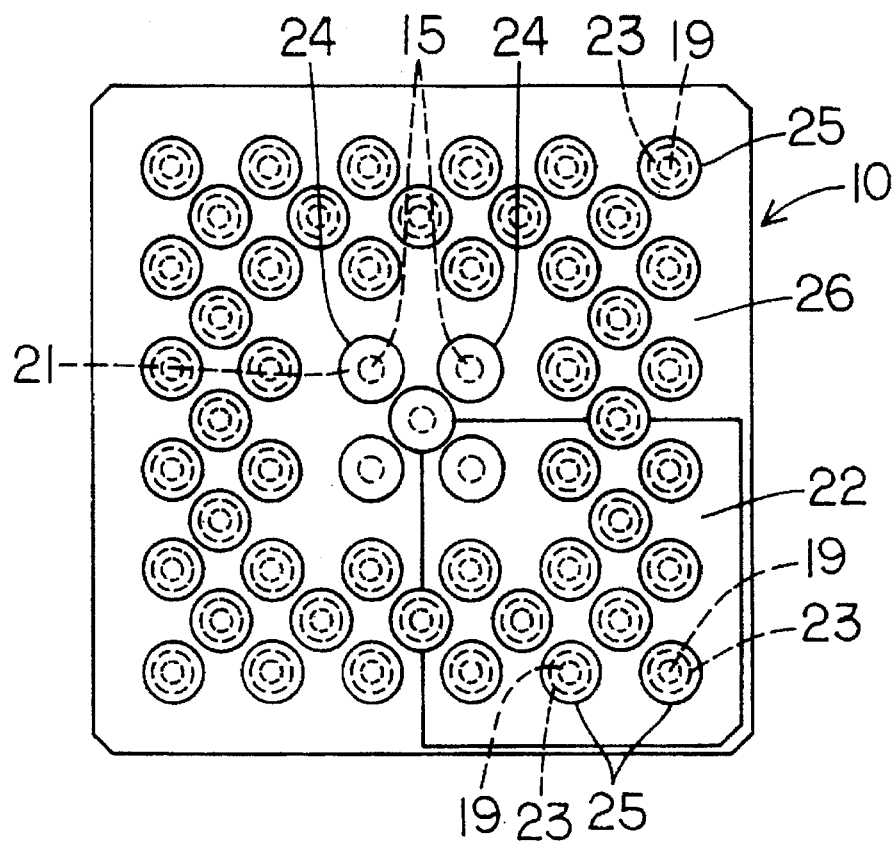
FIG. 3 is a rear view with a part broken away of the semiconductor device.

As shown in FIG. 1 to FIG. 3, a semiconductor device 10 according to one embodiment of the present invention includes a circuit substrate 13 which is provided with a first lead pattern 11 on a front surface thereof and a second lead pattern 12 on a back surface thereof.

As shown in FIG. 1 and FIG. 2, a substrate 14 of the circuit substrate 13 may preferably be a resin made substrate which is made of glass fabrics reinforced epoxy resin and the first lead pattern 11 is formed on the front surface by etching a copper leaf layer. The first lead pattern 11 is disposed at the central portion of the circuit substrate 13. The first lead pattern 11 comprises a square die mounting region 16 which is provided with a plurality of first vias 15 which are in turn electrically connected with the second lead pattern 12 and a plurality of conductive leads 17 which are disposed around the die mounting region 16. The inner extremities of the conductive leads 17 are distributed along the periphery of the die mounting region 16 in a spaced-apart manner and a precious metal plating is applied on each inner extremity to provide a wire bonding portion 18. Outer extremities of the conductive leads 17 are extended toward the periphery of the circuit substrate 13, while the midst portions of the conductive leads 17 are connected with a plurality of second vias 19 which are disposed around the die mounting region 16 in a grid array. Furthermore, these conductive leads 17 are covered with and protected by a first dielectric layer 20 which forms an insulation coating.

As shown in FIG. 3, the second lead pattern 12 provided on the back surface of the circuit substrate 13 is formed by etching a copper leaf layer applied on the back surface of the circuit substrate 13. The second lead pattern 12 comprises a ground plane 22 which is provided with a plurality of first outer connecting terminal lands 21 which are in turn directly connected with the first vias 15 and a plurality of second outer connecting terminal lands 23 which are respectively connected with the second vias 19. The ground plane 22 encircles the respective second outer connecting terminal lands 23 which are distributed in a grid array with a desired annular gap.

As shown in FIG. 1, a plurality of solder balls 24, 25 which are electrically connected with a printed wiring board (not shown in the drawings) are mounted on the first and second outer connecting terminal lands 21, 23. The surface of the ground plane 22 which is made of copper leaf is covered with a second dielectric layer 26 which forms an insulation layer for protecting the layer from erosion.

The solder balls 24, 25 are connected with a plurality of mold pads mounted on the printed wiring board so as to establish a thermal and electrical connection, while the solder balls 24, 25 are connected with the first and second outer connecting terminal lands 21, 23 which are exposed to atmosphere by means of flux. The first and second outer connecting terminal lands 21, 23 may preferably be provided with a precious metal plating such as a gold plating on the surface thereof so as to improve the adhesive strength thereof with the solder balls 24, 25.

Figure 4:
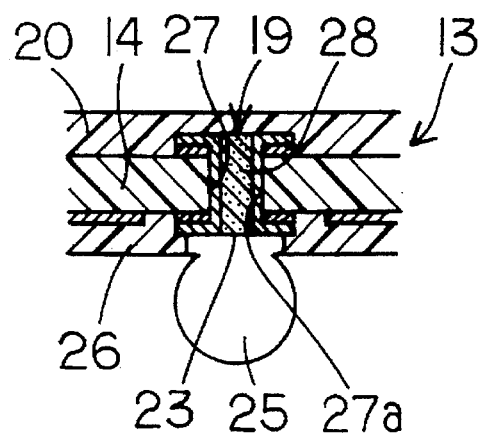
FIG. 4 is a partial cross sectional view of the semiconductor device showing one manner of connection between a via and a solder ball.

As shown in FIG. 4, each second via 19 is constructed by applying an electroless plating 27a on the inner wall of a through hole 27 which passes through the circuit substrate 13 and subsequently filling electrically conductive paste 28 in the through hole 27. Thus, the second vias 19 provide electrical and thermal conductive passages.

Figure 5:
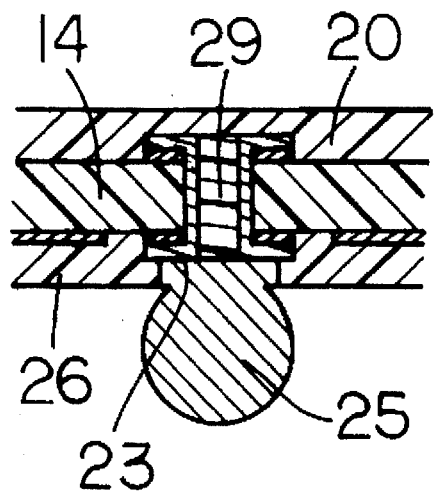
FIG. 5 is a partial cross sectional view of the semiconductor device showing another manner of connection between a via and a solder ball.
Figure 6:
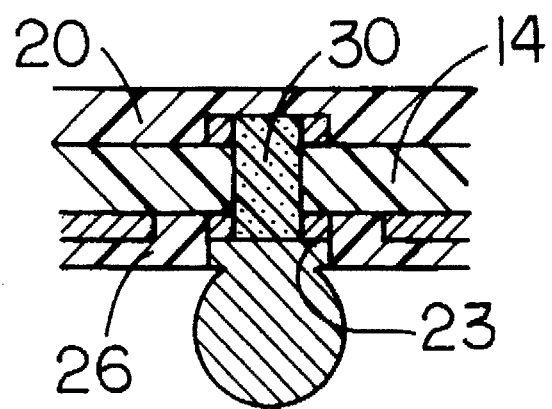
FIG. 6 is a partial cross sectional view of the semiconductor device showing still another manner of connection between a via and a solder ball.

Modifications of the above-mentioned second via 19 is shown in FIG. 5 and FIG. 6. In FIG. 5, solder resin 29 is filled in the through hole 27 in place of the electrically conductive paste 28, while in FIG. 6, electrically conductive paste 30 is directly filled in the through hole 27 which passes through the circuit substrate 13. With the via construction shown in FIG. 6, the electroless plating is unnecessitated so that the operability is greatly enhanced.

Although the via construction was explained in view of the second vias 19 so far, it must be noted that the first vias 15 have the same via construction.

On the die mounting region 16 formed on the front surface of the circuit substrate 13, a semiconductor die 32 is fixedly mounted by means of an electrically conductive adhering agent 31 which is made of copper paste, silver paste and the like. A plurality of electrode pads 33 mounted on the semiconductor die 32 are respectively connected with a plurality of corresponding wire bonding portions 18 by means of a plurality of bonding wires 34.

The semiconductor die 32 and the bonding wires 34 are protected by a resin package 35 which has one surface thereof hermetically sealed by a transfer resin mold.

The above-mentioned first and second dielectric layers 20, 26 are both made of a solder resist or a photo curing dry film. An opening for exposing the die mounting region 16 to atmosphere and a multiplicity of anchoring holes 36 are formed in the first dielectric layer 20, wherein the anchoring holes 36 are formed at a desired interval from each other at a location remote from the opening. The anchoring holes 36 are provided for increasing the adhesive strength of the resin package 35 thus preventing the peeling off of the resin package 35.

Since the semiconductor device 10 according to the present invention is provided with the above-mentioned construction, a connecting path which connects the semiconductor die 32 with the outside printed wiring board (not shown in the drawing) is constituted by the electrode pads 33 of the semiconductor die 32, bonding wires 34, the conductive leads 17, the second vias 19 and the solder balls 25. Especially, since, in this connecting path, the solder balls 25 are directly connected with the conductive leads 17 by way of the second vias 19, the connecting path can be considerably shortened so that the signal transmitting efficiency is greatly enhanced.

Furthermore, since a heat diffusion path for diffusing the heat generated by the semiconductor die 32 is established by connecting the die mounting region 16 and the ground plane 22 with five first vias 15, the heat generated by the semiconductor die 32 can be diffused to the ground plane 22 by way of the electrically conductive adhering agent 31, the die mounting region 16 and five first vias 15. The heat transmitted to the ground plane 22 in the above manner is diffused to a ground plane of the outside printed wiring board (not shown in the drawings) by way of the solder balls 24 and are dissipated in atmosphere. Accordingly, the semiconductor device 10 is protected from rupture or malfunction thereof caused by a thermal shock.

Still furthermore, the ground plane 22 is used as a ground while the semiconductor die 32 is connected with the ground plane 22 by way of the electrically conductive adhering agent 31, the die mounting region 16 and the first vias 15. The ground plane 22 also covers the entire back surface of the circuit substrate 13 with an exception of a plurality of second outer connecting terminal lands 23 and a plurality of annular spaces encircling the second outer connecting terminal lands 23. Accordingly, when the ground plane 22 is grounded to the printed wiring board by way of the solder balls 24, the occurrence of magnetic noises such as cross talks can be prevented effectively and the operation of the semiconductor device is stabilized.

Although one embodiment has been described in detail herein with reference to the accompanying drawings, it is understood that the invention is not limited to these precise embodiments, and that various changes and modifications may be effected therein by one skilled in the art without departing from the scope or spirit of the invention as defined in the appended claims.

We claim:

1. A ball grid assembly type semiconductor device comprising:

a) a circuit substrate having a first lead pattern and a second lead pattern on a front surface and a rear surface of said circuit substrate respectively, said first lead pattern having a die mounted region at a central portion of said front surface of said circuit substrate and a plurality of conductive leads arranged around said die mounting region on said front surface of said circuit substrate, said second lead pattern including a plurality of first outer connecting terminal lands connected with said die mounted region by a plurality of first vias, a plurality of second outer connected terminal lands connected with said conductive leads of said first lead pattern to a plurality of second vias, a ground plane substantially entirely covering said rear surface and electrically connected with said first outer connected terminal lands and electrically and magnetically shielded from said second outer connecting terminal lands by a plurality of annular gaps around said second outer connecting terminal lands, b) a first dielectric layer coated on said first lead pattern and a second dielectric layer coated on said second lead pattern, but not on said first and second outer connecting terminal lands, said first and second dielectric layers being silk screen printed solder resistant film layers, c) a plurality of solder balls mounted on said first and second outer connecting terminal lands respectively, d) a semiconductor die fixedly mounted on said die mounting region by an electrically conductive adhering agent, e) a plurality of bonding wires connecting a plurality of electrode pads mounted on said semiconductor die with a plurality of said conductive leads respectively, and f) a resin package sealing said front surface of said circuit substrate on which said semiconductor die and said bonding wires are mounted.

2. A ball grid assembly type semiconductor device comprising:

a) a circuit substrate having a first lead pattern and a second lead pattern on a front surface and a rear surface respectively, of said circuit substrate, said first lead pattern having a die mounted region at a central portion on said front surface of said circuit substrate and a plurality of conductive leads arranged around said die mounting region on said front surface of said circuit substrate, said second lead pattern including a plurality of first outer connecting terminals connected with said die mounting region by a plurality of first vias, a plurality of second outer connecting terminal lands connected with said conductive leads of said first lead pattern by a plurality of second vias, a ground plane on said rear surface of said circuit substrate entirely covering said rear surface of said circuit substrate, said ground plane being electrically connected with said first outer connecting terminal lands and being electrically and magnetically shielded by said second outer connecting terminal lands by a plurality of annular gap around said second outer connecting terminal lands, b) a plurality of solder balls mounted on said first and second outer connecting terminal lands respectively, c) a semiconductor die fixedly mounted on said die mounting region by an electrically conductive adhering agent, d) a plurality of bonding wires connecting a plurality of electrode pads mounted on said semiconductor with a plurality of said conductive leads respectively, and e) a resin package sealing said front surface of said substrate on which said semiconductor die and said bonding wires are mounted.

3. A ball grid assembly type semiconductor device according to claim 2, wherein said first lead pattern is coated with a first dielectric layer and said second lead pattern is coated with a second dielectric layer and said first and second outer connecting terminal lands are not coated.

4. A ball grid assembly type semiconductor device according to claim 2, wherein said first and second dielectric layers are solder resist photo cured dry film layers.

5. A ball grid assembly type semiconductor device according to claim 3, wherein said first and second dielectric layers are solder resist silk screen printed film layers.

6. A ball grid assembly type semiconductor device according to claim 3, wherein said second dielectric layer has a multiplicity of dimples on the surface thereof.

7. A ball grid assembly type semiconductor device according to claim 2, wherein said first and second vias are respectively made of electroless copper plating on an inner wall of a plurality of through holes formed in place in said circuit substrate and a plurality of electrically conductive pastes filled in said through holes.

8. A ball grid assembly type semiconductor device according to claim 7, wherein said electrically conductive paste is selected from a group consisting of a copper paste and a silver paste.

9. A ball grid assembly type semiconductor device according to claim 2, wherein said first and second vias are respectively of a plurality of electrically conductive pastes directly filled in a plurality of through holes formed in place in said circuit substrate.

10. A ball grid assembly type semiconductor device according to claim 9, wherein said electrically conductive paste is selected from a group consisting of a copper paste and a silver paste.

11. A ball grid assembly type semiconductor device according to claim 2, wherein said first and second vias are respectively electroless copper plating on inner walls of a plurality of through holes formed in place in said circuit substrate with a plurality of solder resins filled in said through holes.

\* \* \* \* \*